United States Patent
Hashemi et al.

(10) Patent No.: US 9,755,078 B2
(45) Date of Patent: Sep. 5, 2017

(54) STRUCTURE AND METHOD FOR MULTI-THRESHOLD VOLTAGE ADJUSTED SILICON GERMANIUM ALLOY DEVICES WITH SAME SILICON GERMANIUM CONTENT

(71) Applicant: International Business Machines Corporation, Armonk, NY (US)

(72) Inventors: Pouya Hashemi, White Plains, NY (US); Pranita Kerber, Mount Kisco, NY (US); Christine Q. Ouyang, Yorktown Heights, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/921,384

(22) Filed: Oct. 23, 2015

(65) Prior Publication Data

US 2017/0117413 A1    Apr. 27, 2017

(51) Int. Cl.
| | |
|---|---|
| *H01L 21/70* | (2006.01) |
| *H01L 29/78* | (2006.01) |
| *H01L 27/092* | (2006.01) |
| *H01L 21/8238* | (2006.01) |

(52) U.S. Cl.
CPC .. *H01L 29/7849* (2013.01); *H01L 21/823807* (2013.01); *H01L 21/823821* (2013.01); *H01L 27/0924* (2013.01)

(58) Field of Classification Search
CPC ......... H01L 29/7849; H01L 21/823807; H01L 27/0924; H01L 21/823821
See application file for complete search history.

(56) References Cited

U.S. PATENT DOCUMENTS

| | | |
|---|---|---|
| 6,878,610 B1 | 4/2005 | Lin et al. |
| 7,358,166 B2 | 4/2008 | Agnello et al. |
| 8,227,792 B2 | 7/2012 | Agnello et al. |
| 8,686,514 B2 | 4/2014 | Guo et al. |
| 8,951,870 B2 | 2/2015 | Basker et al. |
| 8,987,069 B1 | 3/2015 | Adam et al. |

(Continued)

FOREIGN PATENT DOCUMENTS

CN            103681326 A        3/2014

*Primary Examiner* — Reema Patel
*Assistant Examiner* — Syed Gheyas
(74) *Attorney, Agent, or Firm* — Scully, Scott, Murphy & Presser, P.C.; Louis J. Percello, Esq.

(57) ABSTRACT

A semiconductor structure includes a first fin structure having a first strain located on a surface of a first insulator layer portion. The first fin structure includes a first doped silicon germanium alloy fin portion having a first germanium content and a silicon germanium alloy fin portion having a third germanium content. A second fin structure having a second strain is located on a surface of a second insulator layer portion. The second fin structure includes a second doped silicon germanium alloy fin portion having a second germanium content and a silicon germanium alloy fin portion having the third germanium content, wherein the first germanium content differs from the second germanium content and the third germanium content is greater than the first and second germanium contents, and wherein the first strain differs from the second strain.

14 Claims, 5 Drawing Sheets

(56) References Cited

U.S. PATENT DOCUMENTS

| | | | |
|---|---|---|---|
| 9,087,860 B1* | 7/2015 | Banghart | H01L 29/66803 |
| 2014/0097518 A1* | 4/2014 | Cheng | H01L 29/0649 |
| | | | 257/618 |
| 2014/0312423 A1 | 10/2014 | Cheng et al. | |
| 2015/0206965 A1* | 7/2015 | Cheng | H01L 29/785 |
| | | | 257/190 |
| 2016/0141368 A1* | 5/2016 | Cheng | H01L 29/1054 |
| | | | 257/347 |

* cited by examiner

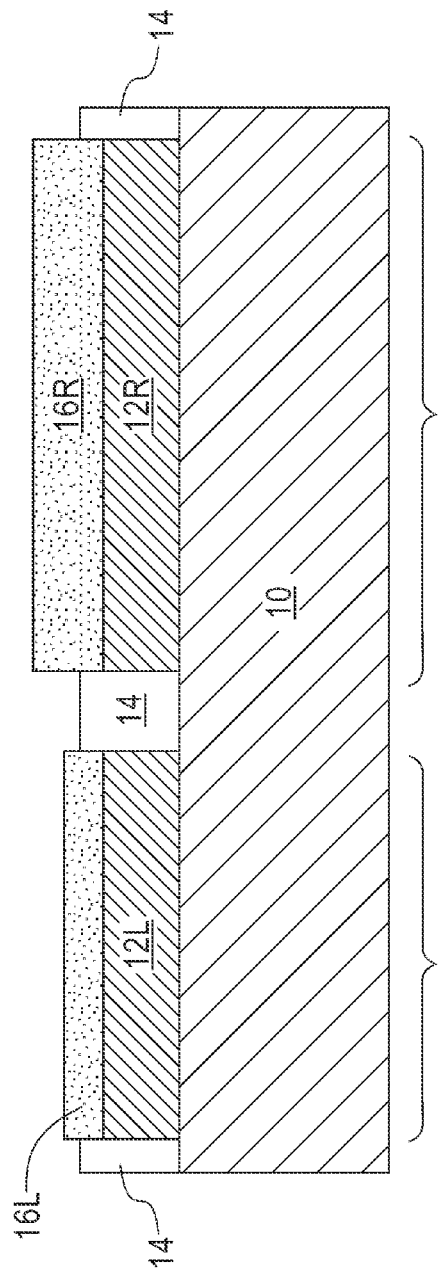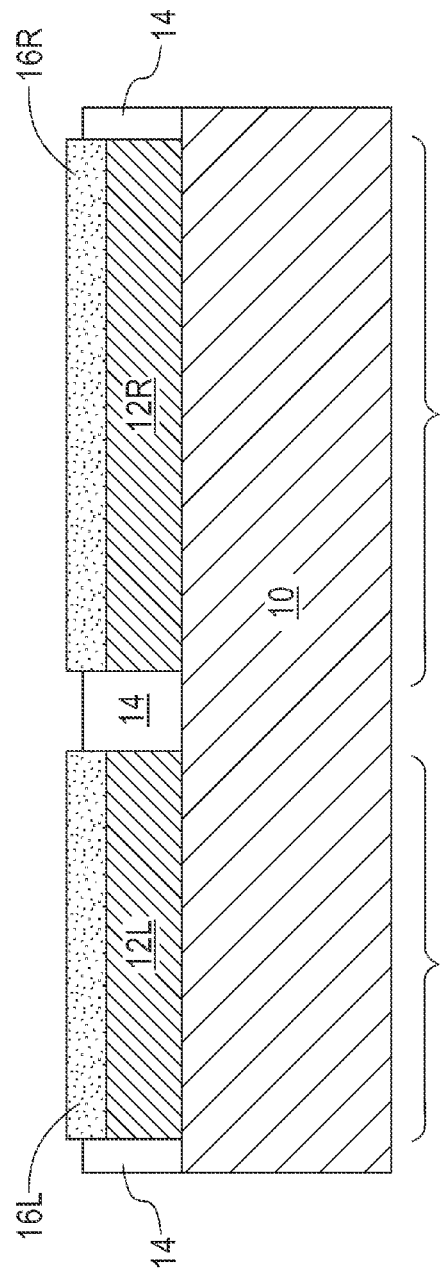

STRUCTURE AND METHOD FOR MULTI-THRESHOLD VOLTAGE ADJUSTED SILICON GERMANIUM ALLOY DEVICES WITH SAME SILICON GERMANIUM CONTENT

BACKGROUND

The present application relates to semiconductor technology, and more particularly to a semiconductor structure containing a first fin structure containing a silicon germanium alloy fin portion having a germanium content and a first strain, and a second fin structure containing a silicon germanium alloy fin portion having the same germanium content as the first silicon germanium alloy fin portion and a second strain, wherein the second strain is different from the first strain. The present application also provides a method of forming such a semiconductor structure from a substrate that contains silicon germanium alloy regions having different germanium content.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs. In order to extend these devices for multiple technology nodes such as, for example, 10 nm and beyond, there is a need to boost the performance with high-mobility channels. In such FinFET devices, a fin containing a silicon germanium alloy is one promising channel material because of its high-carrier mobility.

Device scaling and the necessary fin thickness scaling to maintain electrostatic integrity continues to reduce the gate contact area making a replacement metal gate process challenging. Current and future technologies nodes limit the gate length to less than 20 nm resulting in very tight process tolerances for workfunction tuning layers in the replacement metal gate process. This problem is further exacerbated for Fin geometries where thin metal layers have to be deposited conformally on the Fin sidewalls.

In view of the above, there is a need for providing a semiconductor structure containing multiple threshold voltage adjusted silicon germanium alloy fins which avoids the drawbacks mentioned above for prior art processes.

SUMMARY

In one aspect of the present application, a semiconductor structure is provided. In one embodiment of the present application, the semiconductor structure includes a first fin structure having a first strain located on a surface of a first insulator layer portion and within a first device region of a substrate, wherein the first fin structure comprises, from bottom to top, a first doped silicon germanium alloy fin portion having a first germanium content and a silicon germanium alloy fin portion having a third germanium content. The structure further includes a second fin structure having a second strain located on a surface of a second insulator layer portion and within a second device region of the substrate, wherein the second fin structure comprises, from bottom to top, a second doped silicon germanium alloy fin portion having a second germanium content and a silicon germanium alloy fin portion having the third germanium content, wherein the first germanium content is different from the second germanium content and the third germanium content is greater than the first and second germanium contents, and wherein the first strain is different from the second strain.

In another aspect of the present application, a method of forming a semiconductor structure is provided. In one embodiment of the present application, the method includes providing a first material stack of, from bottom to top, a first insulator layer portion and a first doped silicon germanium alloy portion having a first germanium content located within a first device region of a substrate and a second material stack of, from bottom to top, a second insulator layer portion and a second doped silicon germanium alloy portion having a second germanium content that differs from the first germanium content located within a second device region of the substrate. Next, a silicon germanium alloy portion having a third germanium content is formed on each of the first and second doped silicon germanium alloy portions, wherein the third germanium content is greater than the first germanium content and the second germanium content. The silicon germanium alloy portion and the underlying first doped silicon germanium alloy portion are patterned to provide a first fin structure having a first strain, and the silicon germanium alloy portion and the underlying second doped silicon germanium alloy portion are also patterned to provide a second fin structure having a second strain that differs from the first strain.

BRIEF DESCRIPTION OF SEVERAL VIEWS OF THE DRAWINGS

FIG. 1 is a cross sectional view of an exemplary semiconductor structure including a first silicon germanium alloy portion having a first germanium content and located on a first insulator layer portion, and a second silicon germanium alloy portion having a second germanium content and located on a second insulator layer portion that can be employed in accordance with an embodiment of the present application.

FIG. 2 is a cross sectional view of the exemplary semiconductor structure of FIG. 1 after performing a planarization process.

DETAILED DESCRIPTION

Figure 3:
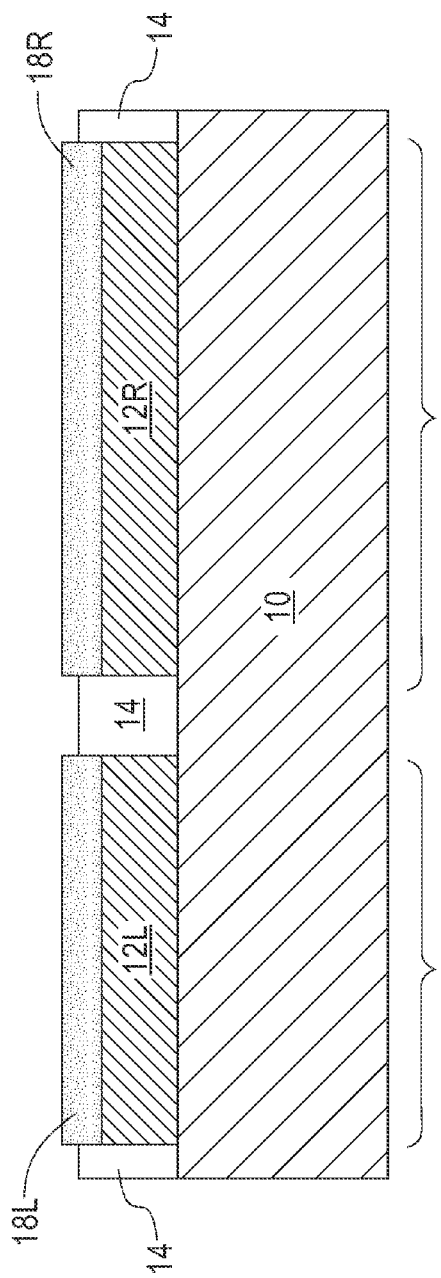
FIG. 3 is a cross sectional view of the exemplary semiconductor structure of FIG. 2 after introducing a dopant into the first silicon germanium alloy portion and into the second silicon germanium alloy portion.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

For a given germanium content in a silicon germanium alloy, the device threshold voltage depends on the strain-state of the silicon germanium alloy channel material. Thus, the method of the present application to be described in greater detail herein below can tune the device threshold voltage for silicon germanium alloy channel materials having a same germanium content, yet having different strain states.

Referring first to FIG. 1, there is illustrated an exemplary semiconductor structure including a first silicon germanium alloy portion 16L having a first germanium content and located on a first insulator layer portion 12L, and a second silicon germanium alloy portion 16R having a second germanium content and located on a second insulator layer portion 12R that can be employed in accordance with an embodiment of the present application. As is shown, the first silicon germanium alloy portion 16L and the first insulator layer portion 12L are located on a first portion of a handle substrate 10 and within a first device region 100L, while the second silicon germanium alloy portion 16R and the second insulator layer portion 12R are located on a second portion of the handle substrate 10 and within a second device region 100R.

The first silicon germanium alloy portion 16L and the first insulator layer portion 12L may be referred to herein as a first material stack, while the second silicon germanium alloy portion 16R and the second insulator layer portion 12R may be referred to herein as a second material stack. An isolation structure 14 is present on the handle substrate 10 and separates the first material stack (12L, 16L) from the second material stack (12R, 16R). As is shown, the height of the isolation structure 14, as measured from a bottommost surface to a topmost surface, is less than the height, as measured from a bottommost surface to a topmost surface, of both the first silicon germanium alloy portion 16L and second silicon germanium alloy portion 16R.

As is further shown, the bottommost surface of the first insulator layer portion 12L is coplanar with a bottommost surface of the second insulator layer portion 12R. Also, the bottommost surface of each of the first and second insulator layer portions 12L, 12R directly contacts a topmost surface of the handle substrate 10. As is further shown, the bottommost surface of the first silicon germanium alloy portion 16L is coplanar with a bottommost surface of the second silicon germanium alloy portion 16R. Also, the bottommost surface of the first silicon germanium alloy portion 16L directly contacts a topmost surface of the first insulator layer portion 12L, and the bottommost surface of the second silicon germanium alloy portion 16R directly contacts a topmost surface of the second insulator layer portion 12R. In the illustrated embodiment, the topmost surface of the first silicon germanium alloy portion 16L is not coplanar with a topmost surface of the second silicon germanium alloy portion 16R. Instead, the topmost surface of the first silicon germanium alloy portion 16L is located beneath a topmost surface of the second silicon germanium alloy portion 16R. Stated in other terms the height, as measured from the bottommost surface to the topmost surface, of the first silicon germanium alloy portion 16L is less than the height, as measured from the bottommost surface to the topmost surface, of the second silicon germanium alloy portion 16R.

In some embodiments (not shown), the topmost surface of the first silicon germanium alloy portion 16L may be coplanar with a topmost surface of the second silicon germanium alloy portion 16R.

In accordance with the present application and as shown, the first silicon germanium alloy portion 16L has sidewall surfaces that are vertically aligned with the sidewall surfaces of the underlying first insulator layer portion 12L. Thus, the first silicon germanium alloy portion 16L has a cross sectional length that is the same as that of the underlying first insulator layer portion 12L. Likewise, the second silicon germanium alloy portion 16R has sidewall surfaces that are vertically aligned with the sidewall surfaces of the underlying second insulator layer portion 12R. Thus, the second silicon germanium alloy portion 16R has a cross sectional length that is the same as that of the underlying second insulator layer portion 12R.

In accordance with the present application, the first silicon germanium alloy portion 16L and the second silicon germanium alloy portion 16R are each single crystalline silicon germanium materials that are fully relaxed (i.e., they have no strain).

In one embodiment of the present application, the first germanium content of the first silicon germanium alloy portion 16L is less than the second germanium content of the second silicon germanium alloy portion 16R. In one example, the first germanium content of the first silicon germanium alloy portion 16L can be from 15 atomic % germanium to 50 atomic % germanium, while the second germanium content of the second silicon germanium alloy portion 16R can be from 25 atomic % germanium to 60 atomic % germanium. In another embodiment of the present application, the first germanium content of the first silicon germanium alloy portion 16L is greater than the second germanium content of the second silicon germanium alloy portion 16R. In one example, the first germanium content of the first silicon germanium alloy portion 16L can be from 25 atomic % germanium to 60 atomic % germanium, while the second germanium content of the second silicon germanium alloy portion 16R can be from 15 atomic % germanium to 50 atomic % germanium.

The handle substrate 10 of the exemplary semiconductor structure shown in FIG. 1 may include a semiconductor material. The term "semiconductor" as used herein in connection with the semiconductor material of the handle substrate 10 denotes any semiconducting material including, for example, Si, Ge, SiGe, SiC, SiGeC, III-V compound semiconductors or II-VI compound semiconductors. Multilayers of these semiconductor materials can also be used as the semiconductor material of the handle substrate 10. In one embodiment, the handle substrate 10 comprises silicon. In some embodiments, the handle substrate 10 is a non-semiconductor material including, for example, a dielectric material and/or a conductive material.

The crystal orientation of the handle substrate 10 may be {100}, {110}, or {111}. Other crystallographic orientations besides those specifically mentioned can also be used in the present application. The handle substrate 10 may be a single crystalline semiconductor material, a polycrystalline material, or an amorphous material. The thickness of the handle substrate 10 is inconsequential to the present application.

The first and second insulator layer portions (12L, 12R) of the exemplary semiconductor structure shown in FIG. 1 may be a crystalline or non-crystalline oxide or nitride. Typically, the first and second insulator layer portions (12L, 12R) include a same insulator material. In one embodiment, each of the first and second insulator layer portions (12L, 12R) is an oxide such as, for example, silicon dioxide. In another embodiment, each of the first and second insulator layer portions (12L, 12R) is a nitride such as, for example, silicon nitride or boron nitride. In yet other embodiments, each of the first and second insulator layer portions (12L, 12R) is a multilayered stack of, in any order, silicon dioxide and boron nitride. Each of the first and second insulator layer portions (12L, 12R) typically has a thickness from 1 nm to 200 nm. Other thicknesses that are lesser than, or greater than, the aforementioned thickness range may also be used as the thickness of each of the first and second insulator layer portions (12L, 12R).

The exemplary semiconductor structure shown in FIG. 1 can be made by the method that is disclosed in U.S. Pat. No. 8,987,069 to Adam et al., the entire content of which is incorporated herein by reference. Notably, the exemplary semiconductor structure shown in FIG. 1 can be formed by first providing a silicon-on-insulator (SOI) substrate with at least two active regions. Next, a first silicon germanium alloy layer is deposited over each of the at least two active regions of the SOI substrate, followed by the deposition of a silicon layer over each of the first silicon germanium alloy layers. A second silicon germanium alloy layer is then formed over each of the silicon layers. A hard mask is then formed over one of the at least two active regions, and thereafter the deposited second silicon germanium alloy layer of an unmasked active region of the at least two active regions is removed. The deposited hard mask is then removed over a remaining portion of the second silicon germanium alloy layer of one of the at least two active regions, and thereafter a thermal mix process is performed on the remaining silicon and silicon germanium alloy layers of the at least two active regions to form a new silicon germanium alloy layer with uniform germanium concentration for each of the at least two active regions, where the new silicon germanium alloy layer with uniform germanium concentration of one of the at least two active regions has a different concentration of germanium than the new silicon germanium alloy layer with uniform germanium concentration of the other silicon germanium alloy layer. Thermal mixing can be performed by a thermal anneal process that is performed in an inert ambient and at a temperature from 600° C. to 1300° C.

Referring now to FIG. 2, there is illustrated the exemplary semiconductor structure of FIG. 1 after performing a planarization process. In some embodiments of the present application and when the height of the first silicon germanium alloy portion 16L is the same as the height of the second silicon germanium alloy portion 16R, this step of the present application may be omitted. In one embodiment of the present application, planarization may be performed utilizing chemical mechanical polishing (CMP) and/or grinding. In another embodiment, an etch back process may be used to provide the planar structure shown in FIG. 2.

In some embodiments (not shown), the first silicon germanium alloy portion 16L can be thickened by epitaxy (as defined herein below) to provide a planar structure for further processing.

Referring now to FIG. 3, there is illustrated the exemplary semiconductor structure of FIG. 2 after introducing a dopant into the first silicon germanium alloy portion 16L and into the second silicon germanium alloy portion 16R. The first silicon germanium alloy portion containing the dopant may be referred to herein as a first doped silicon germanium alloy portion 18L, while the second silicon germanium alloy portion containing the dopant may be referred to herein as a second doped silicon germanium alloy portion 18R.

The dopant that is introduced into the first and second silicon germanium alloy portions (16L, 16R) may be a p-type dopant or an n-type dopant. Typically, the same dopant is introduced into the first and second silicon germanium alloy portions (16L, 16R). The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In some embodiments, the dopant can be introduced into the first and second silicon germanium alloy portions (16L, 16R) simultaneously. In another embodiment, the dopant can be introduced into the first silicon germanium alloy portion 16L prior to, or after, introducing the dopant into the second silicon germanium alloy portion 16R. Notwithstanding the order of doping, the dopant can be introduced into the first and second silicon germanium alloy portions (16L, 16R) utilizing a gas phase doping process. In one specific example, phosphine is introduced into the first and second silicon germanium alloy portions (16L, 16R) utilizing a gas phase doping process.

In one embodiment of the present application, the first doped silicon germanium alloy portion 18L contains a same dopant concentration as the second doped silicon germanium alloy portion 18R. In another embodiment of the present application, the first doped silicon germanium alloy portion 18L contains a different dopant concentration than the second doped silicon germanium alloy portion 18R. In one example, the concentration of dopant within the first doped silicon germanium alloy portion 18L is from $1\times10^{18}$ atoms/cm$^3$ to $1\times10^{19}$ atoms/cm$^3$ and the concentration of dopant within the second doped silicon germanium alloy portion 18R is from $1\times10^{18}$ atoms/cm$^3$ to $1\times10^{19}$ atoms/cm$^3$.

In some embodiments, the first doped silicon germanium alloy portion 18L and the second doped silicon germanium alloy portion 18R have a uniform dopant concentration throughout the entirety of the material portion. In other embodiments, the first doped silicon germanium alloy portion 18L and the second doped silicon germanium alloy portion 18R have a graded dopant concentration. In one example, the dopant concentration within the first doped silicon germanium alloy portion 18L and the second doped silicon germanium alloy portion 18R may decrease downward from the topmost surface of the material portion.

In some embodiments, the first doped silicon germanium alloy portion 18L and/or the second doped silicon germanium alloy portion 18R can be used as a punch-through stop layer of the resultant semiconductor structure of the present application. Despite being doped, the first doped silicon germanium alloy portion 18L and the second doped silicon germanium alloy portion 18R are each relaxed silicon germanium alloy materials. Also, the first doped silicon germanium alloy portion 18L has the first germanium content mentioned above, while the second doped silicon germanium alloy portion 18R has the second germanium content mentioned above.

In one embodiment of the present application, as shown in FIG. 3, the isolation structure 14 has a topmost surface that is located between a topmost surface and a bottommost surface of both the first and second doped silicon germanium alloy portions (18L, 18R).

Figure 4:
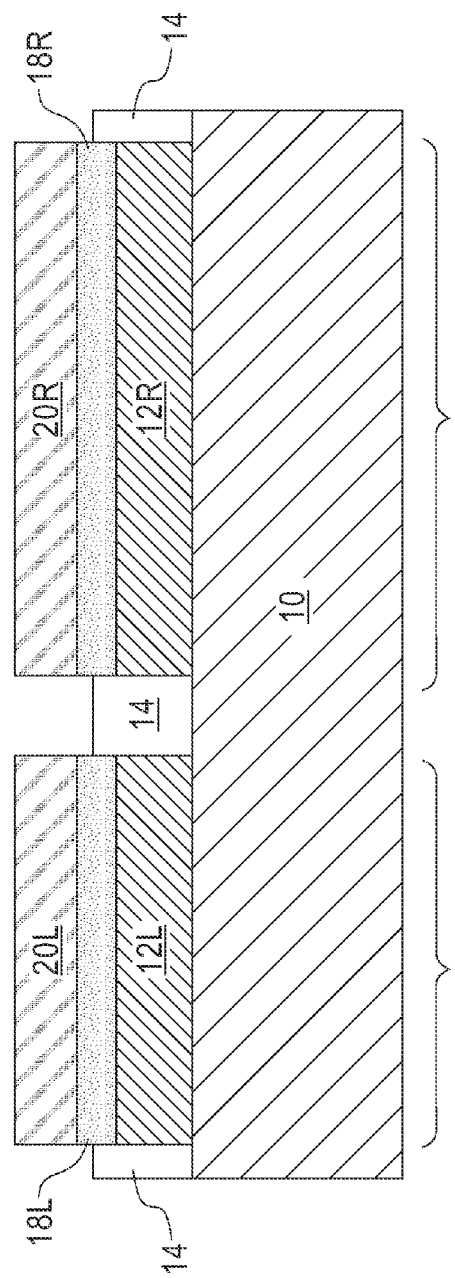
FIG. 4 is a cross sectional view of the exemplary semiconductor structure of FIG. 3 after providing a third silicon germanium alloy portion having a third germanium content that is greater than either the first and second germanium contents on the first doped silicon germanium alloy portion and a fourth silicon germanium alloy portion having the third germanium content on the second doped silicon germanium alloy portion.

Referring now to FIG. 4, there is illustrated the exemplary semiconductor structure of FIG. 3 after providing a third silicon germanium alloy portion 20L having a third germanium content that is greater than either the first and second germanium contents on the first doped silicon germanium alloy portion 18L and a fourth silicon germanium alloy portion 20R having the third germanium content on the second doped silicon germanium alloy portion 18R. In some embodiments of the present application, the third silicon germanium alloy portion 20L provides a channel material for a first transistor device, while the fourth silicon germanium alloy portion 20R provides a channel material for a second transistor device.

In one embodiment of the present application, the third silicon germanium alloy portion 20L and/or the fourth silicon germanium alloy portion 20R may be doped with either an n-type or p-type dopant as mentioned above. In one embodiment, the dopant within the third silicon germanium alloy portion 20L and/or the fourth silicon germanium alloy portion 20R is different from the dopant present in the first doped silicon germanium alloy portion 18L and the second doped silicon germanium alloy portion 18R. In another embodiment, the third silicon germanium alloy portion 20L and/or the fourth silicon germanium alloy portion 20R may be non-doped, (i.e., an intrinsic silicon germanium alloy).

The third silicon germanium alloy portion 20L has a topmost surface and a bottommost surface that is coplanar with a topmost surface and a bottommost surface, respectively, of the fourth silicon germanium alloy portion 20R. Thus, the third silicon germanium alloy portion 20L and the fourth silicon germanium alloy portion 20R have a same height (i.e., thickness). The third silicon germanium alloy portion 20L has sidewall surfaces that are vertically aligned with sidewall surfaces of the underlying first doped silicon germanium alloy portion 18L, while the fourth silicon germanium alloy portion 20R has sidewall surfaces that are vertically aligned with sidewall surfaces of the underlying second doped silicon germanium alloy portion 18R.

In one embodiment of the present application, the third germanium content of the third silicon germanium alloy portion 20L and the fourth silicon germanium alloy portion 20R may be from 40 atomic percent germanium to 85 atomic percent germanium. Other atomic percentages can also be employed as the third germanium content of the third silicon germanium alloy portion 20L and the fourth silicon germanium alloy portion 20R as long as the selected germanium content that provides the third germanium content is greater than the first and second germanium contents mentioned above.

Since the third germanium content of the third silicon germanium alloy portion 20L and the fourth silicon germanium alloy portion 20R is greater than the first germanium content and the second germanium content of the underlying first doped silicon germanium alloy portion 18L and second doped silicon alloy portion 18R, respectively, a strain is present in the third silicon germanium alloy portion 20L and the fourth silicon germanium alloy portion 20R. Also, and since the underlying first doped and second silicon germanium alloy portions 18L, 18R have different germanium contents, the third silicon germanium alloy portion 20L has a first strain, while the fourth silicon germanium alloy portion 20R has a second strain which differs from the first strain. In one example, the first strain is greater than the second strain. In another example, the second strain is greater than the first strain. In one embodiment, and when the first doped silicon germanium alloy portion 18L contains 15 atomic percent germanium, the second doped silicon germanium alloy portion 18R contains 35 atomic percent germanium, and both the third silicon germanium alloy portion 20L and the fourth silicon germanium alloy portion 20R contain 60 atomic percent germanium, then the first strain of the third silicon germanium alloy portion 20L is 45% (corresponding to a 1.9% lattice mismatch strain) and the second strain in the fourth silicon germanium alloy portion 20R is 25% (corresponding to a 1.0% lattice mismatch strain).

The third silicon germanium alloy portion 20L and fourth silicon germanium alloy portion 20R have a height, i.e., thickness, that is less than their critical thickness. The term "critical thickness" denotes a thickness is which defects begin to form in a material layer. Above the critical thickness, the third silicon germanium alloy portion 20L and fourth silicon germanium alloy portion 20R would be too defective for use as channel materials.

The third silicon germanium alloy portion 20L and fourth silicon germanium alloy portion 20R can be formed utilizing a selective epitaxial growth (or deposition) process. The term "selective" when used in conjugation with the phrase "selective epitaxial growth" denotes that the epitaxial material is grown only on semiconductor material surfaces not insulator or conductor surfaces. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, the third silicon germanium alloy portion 20L has an epitaxial relationship with the underlying first doped silicon germanium alloy portion 18L, and the fourth silicon germanium alloy portion 20R has an epitaxial relationship with the underlying second doped silicon germanium alloy portion 18R.

Examples of various epitaxial growth process apparatuses that can be employed in forming the third and fourth silicon germanium alloy portions (20L, 20R) include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking.

In one embodiment, the third and fourth silicon germanium alloy portions (20L, 20R) can be formed utilizing a precursor gas mixture that includes a silicon containing precursor gas (such as silane) and a germanium containing precursor gas (such as a germane). In another embodiment, the third and fourth silicon germanium alloy portions (20L, 20R) can be formed utilizing a precursor gas mixture can be formed utilizing a precursor gas that includes a combined silicon-containing and germanium-containing precursor. Carrier gases like hydrogen, nitrogen, helium and argon can be used. In some embodiments, a dopant can be introduced into the precursor gas during the epitaxial growth process. In other embodiments, a dopant can be introduced after the epitaxial growth process.

Figure 5:
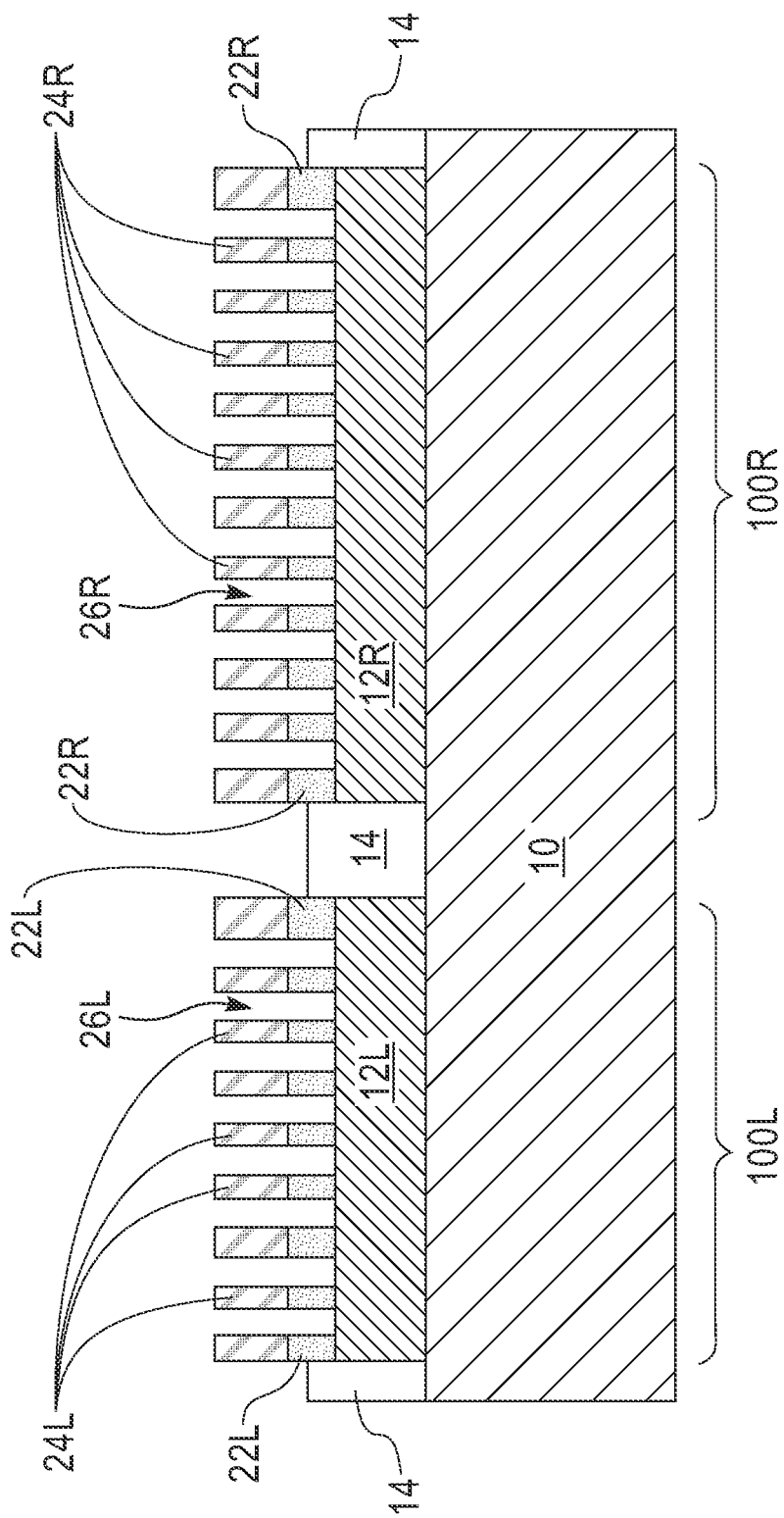
FIG. 5 is a cross sectional view of the exemplary semiconductor structure of FIG. 4 after patterning the material stack of the third silicon germanium alloy portion and the underlying first doped silicon germanium alloy portion to provide a first fin structure having a first strain and the material stack of the fourth silicon germanium alloy portion and the underlying second doped silicon germanium alloy portion to provide a second fin structure having a second strain that differs from the first strain.

Referring now to FIG. 5, there is illustrated the exemplary semiconductor structure of FIG. 4 after patterning the material stack of the third silicon germanium alloy portion 20L and the underlying first doped silicon germanium alloy portion 18L to provide a first fin structure (22L, 24L) having the first strain mentioned above and the fourth silicon germanium alloy portion 20R and the underlying second doped silicon germanium alloy portion 18R to provide a second fin structure (22R, 24R) having the second strain mentioned above. As previous described, the second strain differs from the first strain.

Within the first fin structure (22L, 24L), element 22L denotes a remaining portion of the first doped silicon germanium alloy portion 18L, and element 24L denotes a remaining portion of the third silicon germanium alloy portion 20L. The remaining portion of the first doped silicon germanium alloy portion may be referred to herein as first doped silicon germanium alloy fin portion 22L, while the remaining portion of the third silicon germanium alloy portion 20L may be referred to herein as a third silicon germanium alloy fin portion 24L. Within the second fin structure (22R, 24R), element 22R denotes a remaining portion of the second doped silicon germanium alloy portion 18R, and element 24R denotes a remaining portion of the fourth silicon germanium alloy portion 20R. The remaining portion of the second doped silicon germanium alloy portion may be referred to herein as second doped silicon germanium alloy fin portion 22R, while the remaining portion of the fourth silicon germanium alloy portion 20R may be referred to herein as a fourth silicon germanium alloy fin portion 24R. In some embodiments, element 24L and 24R are used as channel materials, while elements 22L and 22R are used as punch-through stop layers.

In one embodiment, the patterning process used to define the first fin structure (22L, 24L) and the second fin structure (22R, 24R) may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers (i.e., silicon germanium alloy material stack 18L, 20L and silicon germanium alloy material stack 18R, 20R) utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. The etch stops on a topmost surface of the underlying first insulator layer portion 12L and the underlying second insulator layer portion 12R.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), or atomic layer deposition (ALD). Examples of etching that be used in providing the dielectric spacers include any etching process such as, for example, reactive ion etching.

After formation of the dielectric spacers, the SIT process continues by removing each mandrel structure. Each mandrel structure can be removed by an etching process that is selective for removing the mandrel material. Following the mandrel structure removal, the SIT process continues by transferring the pattern provided by the dielectric spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

As used herein, a "fin" refers to a contiguous semiconductor material or stack of semiconductor materials (in the present case the first fin structure contains the first doped silicon germanium alloy fin portion 22L and the third silicon germanium alloy fin portion 24L, while the second fin structure contains a stack of the second doped silicon germanium alloy fin portion 22R and the fourth silicon germanium alloy fin portion 24R), and including a pair of vertical sidewalls that are parallel to each other. As used herein, a surface is "vertical" if there exists a vertical plane from which the surface does not deviate by more than three times the root mean square roughness of the surface. In one embodiment of the present application, a width from 4 nm to 30 nm. Other widths that is lesser than, or greater than the ranges mentioned herein can also be used in the present application. Each silicon germanium alloy fin structure is spaced apart from its nearest neighboring silicon germanium alloy fin structure (22L/24L or 22R/24R) within a given device region (100L, 100R) by a pitch of from 20 nm to 100 nm. Also, each silicon germanium alloy fin structure (22L/24L and 22R/24R) is oriented parallel to each other.

Figure 6:
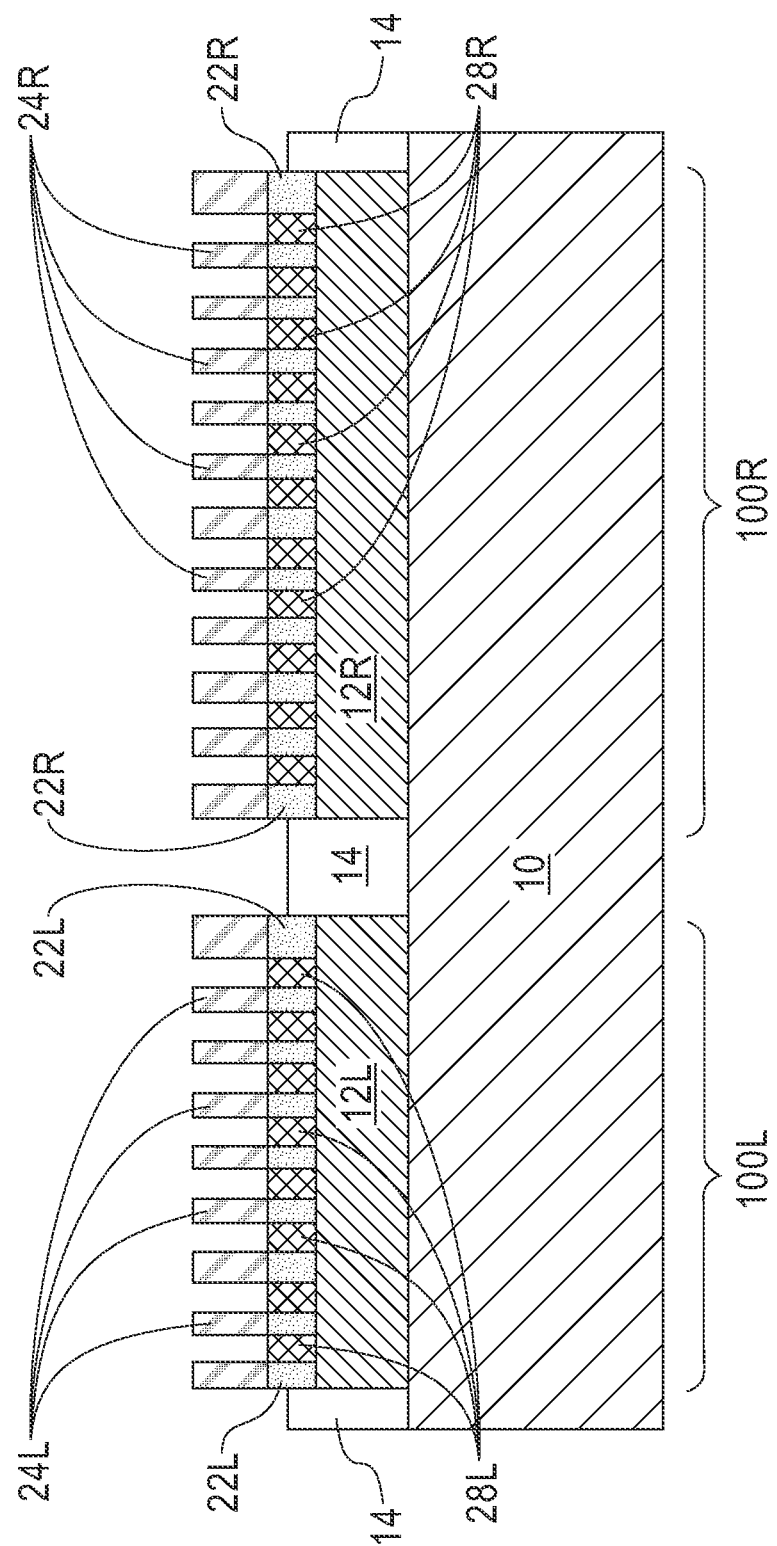
FIG. 6 is a cross sectional view of the exemplary semiconductor structure of FIG. 5 after forming a local isolation structure at the footprint of the first fin structure and another local isolation structure at the footprint of the second fin structure.

Referring now to FIG. 6, there is illustrated the exemplary semiconductor structure of FIG. 5 after forming a local isolation structure 28L at the footprint of the first fin structure (22L, 24L) and another local isolation structure 28R at the footprint of the second fin structure (22R, 24R). Each local isolation structures 28L is located within each gap 26L that is present between each first fin structure (22L, 24L) within the first device region 100L, while each local isolation structure 28R is located within each gap 28L that is present between each second fin structure (22R, 24R) within the second device region 100R.

Each local isolation structure 28L, 28R can be formed by deposition of a trench dielectric material such as, for example, a trench dielectric oxide material. After deposition of the trench dielectric material, the as deposited trench dielectric material is subjected to an etch back process so as to provide the local isolation structures 28L, 28R. As is shown, the etch back is performed until a topmost surface of each local isolation structure 28L is coplanar with a topmost surface of first doped silicon germanium alloy fin portion 22L, and until a topmost surface of each local isolation structure 28R is coplanar with a topmost surface of second doped silicon germanium alloy fin portion 22R.

Figure 7:
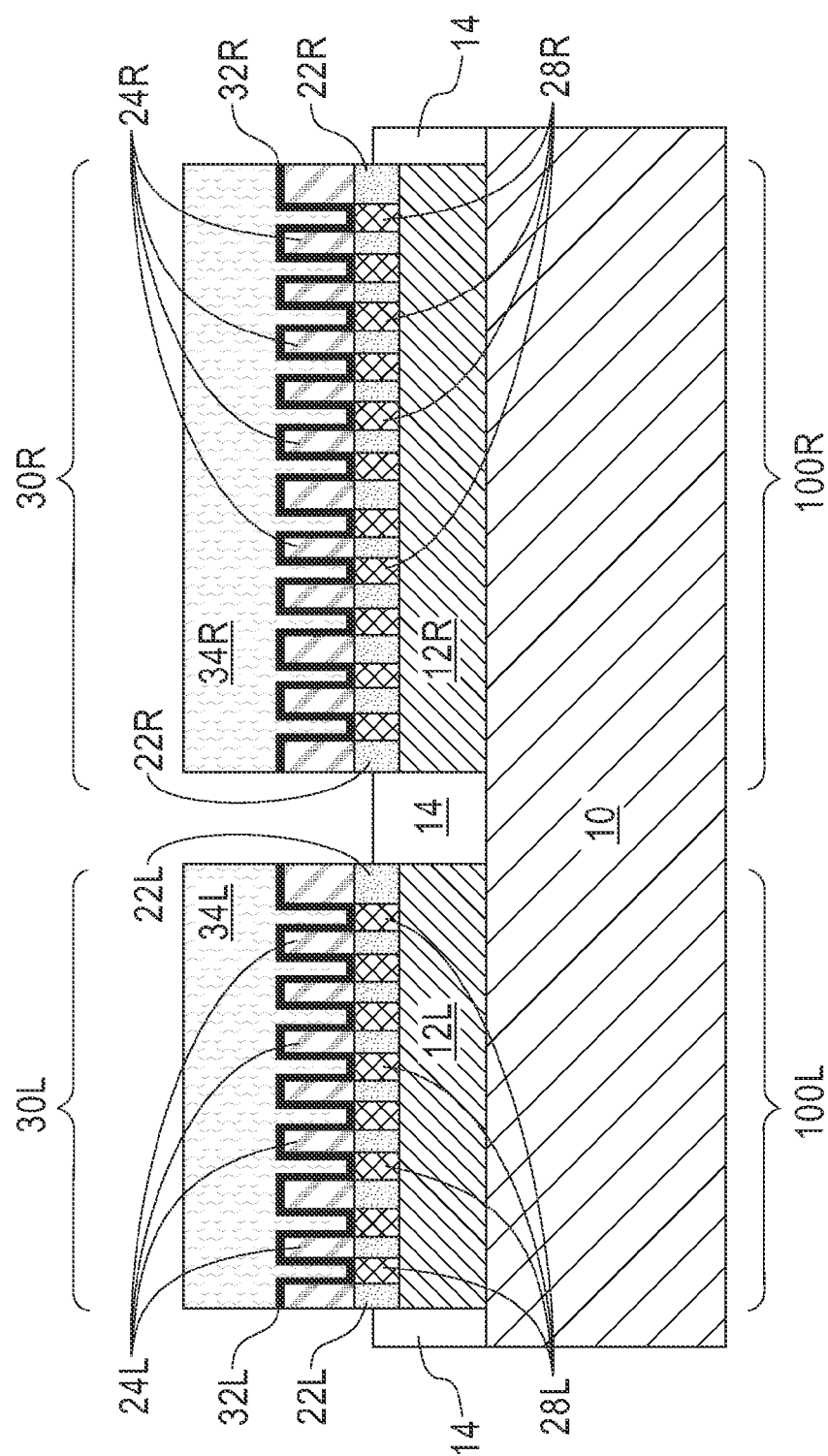
FIG. 7 is a cross sectional view of the exemplary semiconductor structure of FIG. 6 after forming a first functional gate structure straddling over a remaining portion of the third silicon germanium alloy portion within the first fin structure, and a second functional gate structure straddling over a remaining portion of the fourth silicon germanium alloy portion within the second fin structure.

Referring now to FIG. 7, there is illustrated the exemplary semiconductor structure of FIG. 6 after forming a first functional gate structure 30L straddling over the third silicon germanium alloy fin portion 24L of the first fin structure (22L, 24L), and a second functional gate structure 30R straddling over the fourth silicon germanium alloy fin portion 24R of the second fin structure (22R, 24R). In accordance with the present application, the first functional gate structure 30L is formed on a first channel material, i.e., the third silicon germanium alloy fin portion 24L that has the third germanium content and the first strain, while the second functional gate structure 30R is formed on a second channel material, i.e., the fourth silicon germanium alloy fin portion 24R that has the third germanium content and the second strain.

By "functional gate structure" it is meant a permanent gate structure used to control output current (i.e., flow of carriers in the channel) of a semiconducting device through electrical or magnetic fields. Although a single functional gate structure is described and illustrated in each of the first and second device regions (100L, 100R), a plurality of functional gate structures can be formed in the first device region 100L and/or the second device region 100R.

Each first functional gate structure 30L includes a first gate material stack of, from bottom to top, a first gate dielectric portion 32L and a first gate conductor portion 34L. In some embodiments (not shown), a first gate cap portion can be present atop at least the first gate conductor portion 34L. Each second functional gate structure 30R includes a second gate material stack of, from bottom to top, a second gate dielectric portion 32R and a second gate conductor portion 34R. In some embodiments (not shown), a second gate cap portion can be present atop at least the second gate conductor portion 34R.

The first and second gate dielectric portions (32L, 32R) may include a gate dielectric material. The gate dielectric material that provides the first and second gate dielectric portions (32L, 32R) can be an oxide, nitride, and/or oxynitride. In one example, the gate dielectric material that provides the first and second gate dielectric portions (32L, 32R) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as the first and second gate dielectric portions (32L, 32R). In some embodiments, the first gate dielectric portion 32L of the first functional gate structure 30L comprises a same gate dielectric material as the second gate dielectric portion 32R of the second functional gate structure 30R. In other embodiments, the first gate dielectric portion 32L comprises a different gate dielectric material than the second gate dielectric portion 32R.

The gate dielectric material used in providing the first and second gate dielectric portions (32L, 32R) can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions of different functional gate structures, block mask technology can be used. In one embodiment of the present application, the gate dielectric material used in providing the first and second gate dielectric portions (32L, 32R) can have a thickness in a range from 1 nm to 10 nm. Other thicknesses that are lesser than, or greater than, the aforementioned thickness range can also be employed for the gate dielectric material that may provide the first and second gate dielectric portions (32L, 32R).

The first and second gate conductor portions (34L, 34R) can include a gate conductor material. The gate conductor material used in providing the first and second gate conductor portions (34L, 34R) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the first gate conductor portion 34L comprises a same conductive material as the second gate conductor portion 34R. In other embodiments, the first gate conductor portion 34L comprises a different gate conductor material than second gate conductor portion 34R. For example, the first gate conductor portion 34L may comprise an nFET gate metal, while the second gate conductor portion 34R may comprise a pFET gate metal. In another example, the first gate conductor portion 34L may comprise a pFET gate metal, while the second gate conductor portion 34R may comprise an nFET gate metal.

The gate conductor material used in providing the first and second gate conductor portions (34L, 34R) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions of different functional gate structures, block mask technology can be used. In one embodiment, the gate conductor material used in providing the first and second gate conductor portions (34L, 34R) has a thickness from 1 nm to 100 nm. Other thicknesses that are lesser than, or greater than, the aforementioned thickness range can also be employed for the gate conductor material used in providing the first and second gate conductor portions (34L, 34R).

If present, the first and second gate cap portions of the functional gate structures may include a gate cap material. The gate cap material that provides the first and second gate cap portions may include a hard mask material such as, for example, silicon dioxide, silicon nitride, and/or silicon oxynitride. The hard mask material of the first gate gap portion may be the same as, or different from, the hard mask material of the second gate gap portion. The hard mask material that provides the first and second gate cap portions can be formed utilizing a conventional deposition process such as, for example, chemical vapor deposition or plasma enhanced chemical vapor deposition. The material that provides the first and gate cap portions can have a thickness from 5 nm to 20 nm. Other thicknesses that are lesser than, or greater than, the aforementioned thickness range can also be employed as the thickness of the material that provides the first and second gate cap portions.

The first and second functional gate structure (30L, 30R) can be formed by providing a functional gate material stack of, from bottom to top, the gate dielectric material, the gate conductor material and, if present, the gate cap material. A patterning process may follow the formation of the functional gate material stack. Block mask technology may be used to selectively provide one of the functional gate structures prior to forming the other functional gate structure.

A gate spacer (not shown) can be formed around each first functional gate structure 30L, and each second functional gate structure 30R. The gate spacer may include any gate dielectric spacer material such as, for example, silicon dioxide and/or silicon nitride. The gate spacer can be formed by deposition of a gate dielectric spacer material and thereafter etching the deposited gate dielectric spacer material. Source/drain regions can then be formed on exposed portions of each first fin structure (22L, 24L) and each second fin structure (22R, 24R). Notably, the source/drain regions can be formed from exposed surfaces of the third silicon germanium alloy fin portion 24L and the fourth silicon germanium alloy fin portion 24R utilizing an epitaxial growth process as is well known to those skilled in the art.

In other embodiments of the present application, and prior to forming functional gate structures, sacrificial gate structures are formed instead of the first and/or second functional gate structures. In yet other embodiments and when multiple gate structures are formed, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for the first and second gate dielectric portions. Each sacrificial gate material portion includes one of the gate conductor materials mentioned above for the first and second gate conductor portions. The sacrificial gate cap portion includes one of the gate cap materials mentioned above for each first and second gate cap portions. The sacrificial gate structures can be formed by deposition of the various material layers and then patterning the resultant sacrificial dielectric material sack by utilizing, for example, lithography and etching. Next, gate spacers and source/drain regions can be formed as described above, and then the sacrificial gate structure may be replaced with a functional gate structure as described above.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first fin structure having a first strain and located directly on a surface of a first insulator layer portion and within a first device region of a substrate, wherein said first fin structure comprises, from bottom to top, a first doped silicon germanium alloy fin portion having a first germanium content and a silicon germanium alloy fin portion having a third germanium content; and
a second fin structure having a second strain and located directly on a surface of a second insulator layer portion and within a second device region of said substrate, wherein said second insulator layer portion is spaced apart from said first insulator layer portion and said second fin structure comprises, from bottom to top, a second doped silicon germanium alloy fin portion having a second germanium content and a silicon germanium alloy fin portion having said third germanium content, wherein said first germanium content is different from said second germanium content and said third germanium content is greater than said first and second germanium contents, and wherein said first strain is different from said second strain.

2. The semiconductor structure of claim 1, further comprising an isolation structure separating said first device region from said second device region, said isolation structure is located on said substrate.

3. The semiconductor structure of claim 1, further comprising a first local isolation structure located at the footprint of said first fin structure and on an exposed surface of said first insulator layer portion, and a second local isolation structure located at the footprint of said second fin structure and on an exposed surface of said second insulator layer portion.

4. The semiconductor structure of claim 3, wherein a topmost surface of said first local isolation structure is coplanar with a topmost surface of said first doped silicon germanium alloy fin portion, and a topmost surface of said second local isolation structure is coplanar with a topmost surface of said second doped silicon germanium alloy fin portion.

5. The semiconductor structure of claim 1, further comprising a first functional gate structure straddling over exposed surfaces of said silicon germanium alloy fin portion of said first fin structure and a second functional gate structure straddling over exposed surfaces of said silicon germanium alloy fin portion of said second fin structure.

6. The semiconductor structure of claim 1, wherein said silicon germanium alloy fin portion of said first fin structure has an epitaxial relationship with said first doped silicon germanium alloy fin portion, and said silicon germanium alloy fin portion of said second fin structure has an epitaxial relationship with said second doped silicon germanium alloy fin portion.

7. The semiconductor structure of claim 1, wherein said first insulator layer portion has a topmost surface that is coplanar with a topmost surface of said second insulator layer portion.

8. The semiconductor structure of claim 7, wherein said first doped silicon germanium alloy fin portion has a topmost surface that is coplanar with a topmost surface of said second doped silicon germanium alloy fin portion.

9. The semiconductor structure of claim 1, wherein said first germanium content is from 15 atomic percent to 50 atomic percent, said second germanium content is from 25 atomic percent to 60 atomic percent, and said third germanium content is from 40 atomic percent to 85 atomic percent.

10. The semiconductor structure of claim 2, wherein said isolation structure has a topmost surface that is located between a topmost surface and a bottommost surface of both the first and second doped silicon germanium alloy fin portions.

11. The semiconductor structure of claim 1, wherein sidewall surfaces of said first doped silicon germanium alloy fin portion are entirely vertically aligned with sidewall surfaces of said silicon germanium alloy fin portion of said first fin structure.

12. The semiconductor structure of claim 11, wherein said sidewall surfaces of second doped silicon alloy fin portion are entirely vertical aligned with sidewall surface of said silicon germanium alloy fin portion of said second fin structure.

13. The semiconductor structure of claim 2, wherein said isolation structure has a bottommost surface that is coplanar with a bottommost surface of said first insulator layer portion and a bottommost surface of said second insulator layer portion.

14. The semiconductor structure of claim 13, wherein said isolation structure has a topmost surface that is located above a topmost surface of said first insulator layer portion and a topmost surface of said second insulator layer portion.

* * * * *